United States Patent [19]
Barrow

[11] Patent Number: 5,796,589
[45] Date of Patent: Aug. 18, 1998

[54] BALL GRID ARRAY INTEGRATED CIRCUIT PACKAGE THAT HAS VIAS LOCATED WITHIN THE SOLDER PADS OF A PACKAGE

[75] Inventor: Michael Barrow, El Dorado Hills, Calif.

[73] Assignee: Intel Corporation, Santa Clara, Calif.

[21] Appl. No.: 575,917

[22] Filed: Dec. 20, 1995

[51] Int. Cl.$^6$ .............. H01R 9/09; H01L 23/48; H05K 7/02
[52] U.S. Cl. .............. 361/774; 174/260; 174/261; 174/262; 174/263; 174/266; 257/738; 257/778; 361/777; 361/779
[58] Field of Search .............. 174/52.4, 260–266; 216/18, 17, 19; 228/180.21, 180.22; 257/692, 698, 723, 724, 737, 738, 774, 778, 779, 786, 735, 780; 361/760, 772, 774, 777, 779, 783; 437/209, 211, 215; 439/68, 83; 438/125, 613, 369

[56] References Cited

U.S. PATENT DOCUMENTS

| | | |
|---|---|---|
| 4,935,581 | 6/1990 | Komathu . |
| 4,954,308 | 9/1990 | Yabe et al. . |
| 5,136,366 | 8/1992 | Worp et al. . |
| 5,153,385 | 10/1992 | Juskey et al. . |
| 5,216,278 | 6/1993 | Lin et al. . |
| 5,219,117 | 6/1993 | Lin . |
| 5,241,133 | 8/1993 | Mullen, III et al. . |
| 5,254,501 | 10/1993 | Tung et al. . |
| 5,284,287 | 2/1994 | Wilson et al. . |
| 5,285,352 | 2/1994 | Pastore et al. . |
| 5,355,283 | 10/1994 | Marrs et al. .............. 174/52.4 |
| 5,402,314 | 3/1995 | Amago et al. .............. 174/262 |
| 5,493,077 | 2/1996 | Demura .............. 174/262 |
| 5,519,936 | 5/1996 | Andros et al. .............. 437/209 |
| 5,523,920 | 6/1996 | Machuga et al. .............. 361/777 |
| 5,541,368 | 7/1996 | Swamy .............. 174/266 |
| 5,557,502 | 9/1996 | Banerjee et al. .............. 174/261 |
| 5,616,256 | 4/1997 | Demura .............. 216/18 |
| 5,634,268 | 6/1997 | Dalal et al. .............. 228/180.22 |
| 5,637,920 | 6/1997 | Loo .............. 257/700 |
| 5,640,047 | 6/1997 | Nakashima .............. 257/700 |

FOREIGN PATENT DOCUMENTS

| | | | |
|---|---|---|---|
| 2-283091 | 11/1990 | Japan .............. | 439/83 |
| 5-144995 | 11/1993 | Japan .............. | 257/700 |

*Primary Examiner*—Donald Sparks
*Attorney, Agent, or Firm*—Blakely, Sokoloff, Taylor & Zafman

[57] ABSTRACT

A ball grid array (BGA) integrated circuit package which has a plurality of vias located within the solder pads of a package substrate. The substrate supports an integrated circuit which is connected to the solder pads by the vias. Solder balls used to solder the package to an external printed circuit board are attached to the solder pads of the substrate. A solder mask plug is formed within the vias to prevent the solder balls from wicking into the vias. Locating the vias within the solder pads optimizes the routing space of the substrate and increases the routing density of the package.

15 Claims, 1 Drawing Sheet

5,796,589

BALL GRID ARRAY INTEGRATED CIRCUIT PACKAGE THAT HAS VIAS LOCATED WITHIN THE SOLDER PADS OF A PACKAGE

BACKGROUND OF THE INVENTION

1. Field of the Invention

The present invention relates to a ball grid array integrated circuit package.

2. Description of Related Art

Integrated circuits are typically housed within a plastic or ceramic package. Some integrated circuit packages contain a plurality of pins that extended from the package and are soldered to corresponding plated through holes in a printed circuit board. The plated through holes reduce the amount of routing space within the circuit board. Integrated circuits are typically designed to provide more digital signal inputs and outputs (I/O), which require additional routing within the printed circuit board. More electrical routing traces typically required additional layers or thinner trace line widths. Both solutions increase the cost of manufacturing a printed circuit board.

There has been developed electronic package assemblies which mount the integrated circuit package to the surface of the printed circuit board. The integrated circuit package has a number of pins or solder pads that are soldered to corresponding surface pads of the printed circuit board. The integrated circuit package is typically soldered to the printed circuit board by solder paste that is screened onto the surface pads before the package is mounted to the board. Surface mounted integrated circuit packages are typically constructed from co-fired ceramic or molded plastic material.

U.S. Pat. No. 5,216,278 issued to Lin et al. discloses a surface mounted package commonly referred to as a ball grid array (BGA). BGA packages are typically constructed with a substrate that supports the integrated circuit and which is constructed with conventional printed circuit board processes. The surface of the substrate opposite from the integrated circuit contains a plurality of solder pads. After the integrated circuit is mounted and attached to the substrate (and typically enclosed with an encapsulant) a solder ball is placed onto each solder pad. The solder balls are then heated and reflowed to attach the balls to the pads. The solder balls are then subsequently soldered to a printed circuit board to attach the package to the board. A pattern of solder mask is typically placed onto the surface of the substrate to prevent undesirable cross-wicking of solder between solder pads. To allow the solder balls to become attached to the solder pads, the solder mask has a plurality of openings located concentrically with the pads. The solder mask openings have a diameter that is less than the diameter of the solder pads.

As shown in FIG. 1, existing BGA packages have vias 2 that interconnect the solder pads 4 with the opposite side of the substrate. The vias 2 are separated from the solder pads 4 in a "dogbone" configuration. The bottom surface of the package has a layer of solder mask 6. A discussed in the Lin patent, the vias are separated from the solder pads so that solder does not flow into the vias.

By separating the vias from the solder pads, the dogbone configuration creates a less than optimal trace pattern which occupies valuable routing space on the surface of the substrate. It would be desirable to have a BGA package substrate that provides more routing space than substrates of the prior art.

SUMMARY OF THE INVENTION

The present invention is a ball grid array (BGA) integrated circuit package which has a plurality of vias located within the solder pads of a package substrate. The substrate supports an integrated circuit which is connected to the solder pads by the vias. Solder balls used to solder the package to an external printed circuit board are attached to the solder pads of the substrate. A solder mask plug is formed within the vias to prevent the solder balls from wicking into the vias. Locating the vias within the solder pads optimizes the routing space of the substrate and increases the routing density of the package.

BRIEF DESCRIPTION OF THE DRAWINGS

The objects and advantages of the present invention will become more readily apparent to those ordinarily skilled in the art after reviewing the following detailed description and accompanying drawings, wherein.

DETAILED DESCRIPTION OF THE INVENTION

Figure 1:
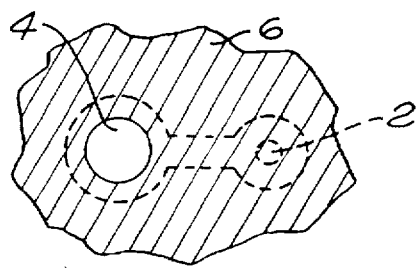
FIG. 1 is a bottom view of an integrated circuit package of the prior art showing a "dogbone" solder pad configuration.
Figure 3:
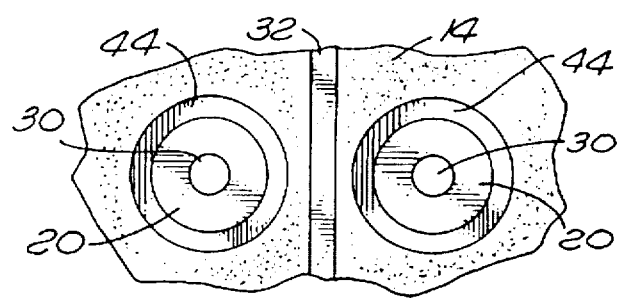
FIG. 3 is a bottom view of the package.
Figure 2:
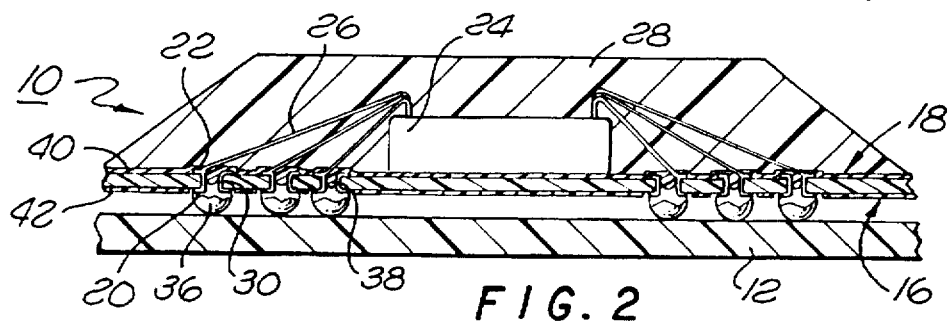
FIG. 2 is a cross-sectional view of a ball grid array package of the present invention.

Referring to the drawings more particularly by reference numbers, FIGS. 2 and 3 show an integrated circuit package 10 of the present invention. The package 10 is typically soldered to an external printed circuit board 12. The package 10 contains a substrate 14 which has a first surface 16 and an opposite second surface 18. The substrate 14 contains both dielectric and conductive material which route electrical power and signals across and through the substrate. The substrate 14 has a center dielectric layer constructed from a flexible polyimide or a rigid epoxy material. The first 16 and second 18 surfaces of the substrate 14 have layers of copper that are etched into desired routing and bus patterns.

The first surface 16 of the substrate 14 has a plurality of solder pads 20. The second surface 18 of the substrate 14 has a plurality of bonding pads 22. The bonding pads 22 are connected to an integrated circuit 24 that is mounted to the substrate 14. The pads 22 and integrated circuit 24 are typically connected by bonding wires 26. Although bonding wires 26 are shown and described, it is to be understood that the components 22 and 24 can be connected by other means such as a tape automated bonding (TAB) tape. Additionally, although an integrated circuit is shown and described, it is to be understood that the package may contain any passive or active electrical device. The integrated circuit 24 and second surface 18 of the substrate 14 are typically covered with a outer shell 28. The shell 28 may be an epoxy or a plastic molded after the integrated circuit is mounted and attached to the substrate 14.

Figure 4:
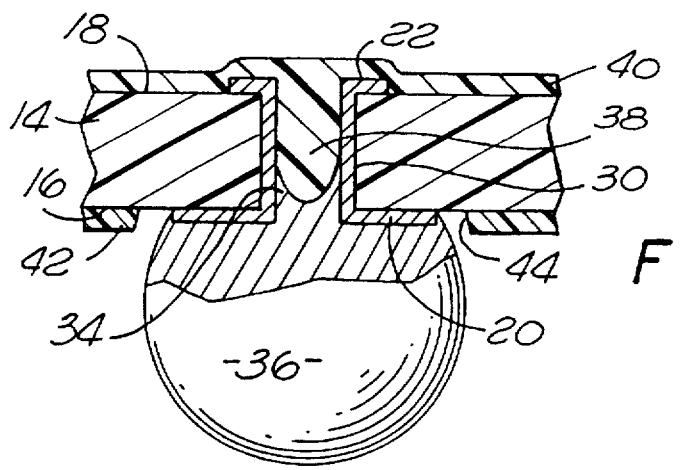
FIG. 4 is an enlarged cross-sectional view of a substrate of the package.

As shown in FIG. 4, the bonding pads 22 are connected to the solder pads 20 by vias 30. The vias 30 terminate within the area of the solder pads 20. Although the vias 30 are shown concentrically located with the pads 22, it is to be understood that the vias 30 may be off-center. As shown in FIG. 3, by placing the vias 30 within the solder pads 20, the substrate 14 of the present invention provides additional routing space on the first surface 16. The routing space allows conductive traces 32 to be routed along the first surface 16 of the substrate 14. This is to be distinguished from prior art BGA packages which separate the vias from the solder pads in a dogbone configuration that occupies more surface area for each pair of solder pads and vias.

Referring to FIG. 4, the vias 30 are typically formed by initially drilling holes into the dielectric material of the substrate and then plating conductive material such as copper into the holes. The formation of the vias 30 typically results in a longitudinal channel 34 through the center of each via 30. Although the board shown in FIG. 4 has external routing layers, it is to be understood that the board may also have internal routing layers.

A solder ball 36 is attached to each solder pad 20 of the substrate 14. The solder balls 36 are typically attached to the solder pads 20, by initially placing a ball onto the pad 20 typically with a vacuum chuck tooling device. The first surface 16 of the substrate 14 is in an upright position so that the solder balls 36 do not fall off of the substrate 14. The solder balls 36 are subsequently heated so that the solder reflows and becomes attached to the solder pads 20. The solder balls 36 are subsequently soldered to corresponding surface pads (not shown) of the printed circuit board 12 to attach the package 10 to the board 12.

To prevent the solder balls 36 from wicking and flowing into the via 30, a solder mask plug 38 is created within the longitudinal channels 32. The solder mask plug 38 can be created by applying a layer of solder mask 40 to the second surface 18 of the substrate 14. In the uncured state, the solder mask is fluid so that a portion of the mask material flows into the channels 34 of the vias 30. Openings (not shown) are formed in the mask 40 to allow the bonding pads 22 to become attached to the integrated circuit 24.

To prevent cross-wicking of solder between the solder pads 20, the first surface 16 of the substrate 14 may have a layer of solder mask 42. As shown in FIG. 3, the solder mask 42 has a plurality of openings 44 that allow the solder balls 36 to wick onto the solder pads 20. The openings 44 typically have a diameter larger than the diameter of the solder pads 20. The smaller diameter solder pads 20 also provides additional routing space on the first surface 16 of the substrate 14.

Figure 5:
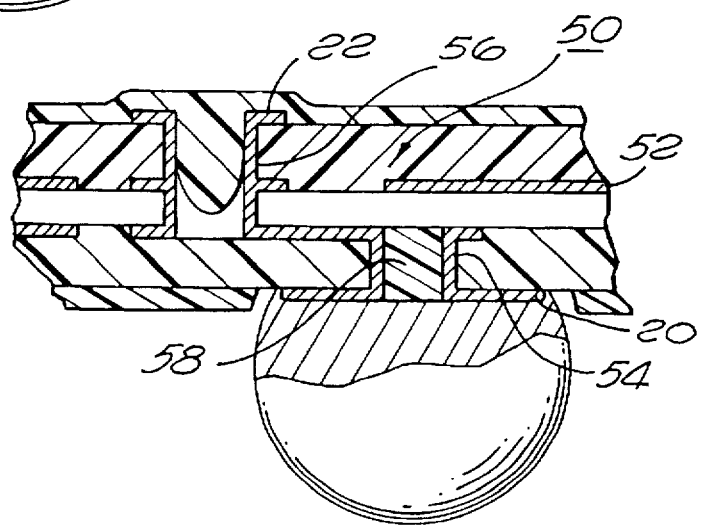
FIG. 5 is an enlarged cross-sectional view of an alternate embodiment of the substrate.

FIG. 5 shows an alternate embodiment of a multi-layered substrate 50 has internal conductive layers 52 that increase the routing density of the substrate 50. One of the internal layers 52 may be connected to a "blind" via 54 that terminates into the solder pad 20. The internal layer 52 may also be connected to a second via 56 that is connected to a bonding pad of the substrate 50. The blind vias 54 terminate within the solder pads to optimize the routing space on the first surface of the substrate. The via 54 may have a resin plug 58 located therein.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An electronic package, comprising:
    a substrate that has a first surface and a second opposite surface;
    a solder pad located on said first surface of said substrate;
    a via which has a longitudinal channel that extends into said substrate and terminates within and extends through said solder pad;
    a first layer of solder mask that is located on said second surface of said substrate and extends into said longitudinal channel of said via; and,
    a solder ball that is attached to said solder pad and is located over said via wherein said solder ball is blocked from extending through said longitudinal channel of said via by said first layer of solder mask.

2. The package as recited in claim 1, further comprising a second layer of solder mask located on said first surface of said substrate, said second layer of solder mask has a first opening with a diameter that is larger than a diameter of said solder pad.

3. The package as recited in claim 1, further comprising a conductive layer connected to said via.

4. The package as recited in claim 3, wherein said conductive layer is located on said second surface of said substrate and said via extends through said substrate.

5. The package as recited in claim 4, further comprising a second layer of solder mask located on said first surface of said substrate, said second layer of solder mask has a first opening with a diameter that is larger than a diameter of said solder pad.

6. The package as recited in claim 3, wherein said conductive layer is located within said substrate and said via extends through a portion of said substrate.

7. The package as recited in claim 6, further comprising a second layer of solder mask located on said second surface of said substrate, said first layer of solder mask has a first opening with a diameter that is larger than a diameter of said solder pad.

8. An integrated circuit package, comprising:
    a substrate that has a first surface and a second opposite surface;
    an integrated circuit located on said second surface of said substrate;
    a solder pad located on said first surface of said substrate;
    a via which has a longitudinal channel that extends into said substrate and terminates within and extends through said solder pad;
    a first layer of solder mask that is located on said second surface of said substrate and extends into said longitudinal channel of said via;
    a solder ball that is attached to said solder pad and is located over said via wherein said solder ball is blocked from extending through said longitudinal channel of said via by said first layer of solder mask; and,
    an outer shell that encloses said integrated circuit.

9. The package as recited in claim 8, further comprising a second layer of solder mask located on said first surface of said substrate, said second layer of solder mask has a first opening with a diameter that is larger than a diameter of said solder pad.

10. The package as recited in claim 8, further comprising a conductive layer connected to said via.

11. The package as recited in claim 10, wherein said conductive layer is located on said second surface of said substrate and said via extends through said substrate.

12. The package as recited in claim 11, further comprising a second layer of solder mask located on said first surface of said substrate, said second layer of solder mask has a first opening with a diameter that is larger than a diameter of said solder pad.

13. The package as recited in claim 10, wherein said conductive layer is located within said substrate and said via extends through a portion of said substrate.

14. The package as recited in claim 13, further comprising a second layer of solder mask located on said first surface of said substrate, said second layer of solder mask has a first opening with a diameter that is larger than a diameter of said solder pad.

15. A method for constructing an electronic package, comprising the steps of:

a) forming a solder pad on a substrate;

b) forming a via within said substrate, wherein said via is located within and extends through said solder pad and has a longitudinal channel that extends through said substrate;

c) forming a solder mask on said substrate so that said solder mask extends into said longitudinal channel;

d) attaching a solder ball to said solder pad over said via; and, e) reflowing said solder ball wherein said solder mask prevents said solder ball from flowing through said longitudinal channel.

* * * * *